US009680073B2

United States Patent
Lee et al.

(10) Patent No.: US 9,680,073 B2
(45) Date of Patent: Jun. 13, 2017

(54) LIGHT EMITTING MODULE

(71) Applicant: Seoul Semiconductor Co., Ltd., Ansan-si (KR)

(72) Inventors: Jin Wook Lee, Ansan-si (KR); Hyuck Jun Kim, Ansan-si (KR); Il Kyung Suh, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 17 days.

(21) Appl. No.: 14/725,928

(22) Filed: May 29, 2015

(65) Prior Publication Data

US 2015/0357518 A1    Dec. 10, 2015

Related U.S. Application Data

(60) Provisional application No. 62/005,369, filed on May 30, 2014.

(51) Int. Cl.
*H01L 33/00* (2010.01)
*H01L 33/58* (2010.01)
*H01L 33/48* (2010.01)

(52) U.S. Cl.
CPC ............ *H01L 33/58* (2013.01); *H01L 33/486* (2013.01)

(58) Field of Classification Search
CPC .......... H01L 33/20; H01L 33/54; H01L 33/58
USPC .......................................................... 257/98
See application file for complete search history.

(56) References Cited

U.S. PATENT DOCUMENTS

| 6,930,332 | B2 * | 8/2005 | Hashimoto | H01L 33/642 257/100 |
| 8,026,526 | B2 * | 9/2011 | Weber-Rabsilber | H01L 33/44 257/100 |
| 8,058,667 | B2 * | 11/2011 | Tran | H01L 33/486 257/687 |
| 2007/0085103 | A1 * | 4/2007 | Nishioka et al. | 257/99 |
| 2010/0133560 | A1 * | 6/2010 | Kim | H01L 33/486 257/89 |
| 2011/0241028 | A1 * | 10/2011 | Park | H01L 33/486 257/88 |
| 2011/0317428 | A1 * | 12/2011 | Paik | F21K 9/23 362/294 |
| 2012/0186077 | A1 * | 7/2012 | Hwu | H01L 25/0753 29/825 |
| 2013/0126913 | A1 * | 5/2013 | Hwu | H01L 25/0753 257/88 |
| 2014/0027807 | A1 * | 1/2014 | Tasaki | H01L 33/58 257/98 |

(Continued)

FOREIGN PATENT DOCUMENTS

KR    2007036900 A * 4/2007

*Primary Examiner* — Eva Y Montalvo
*Assistant Examiner* — Mohammad M Hoque
(74) *Attorney, Agent, or Firm* — H.C. Park & Associates, PLC

(57) ABSTRACT

A light emitting module includes: a substrate having a recess part formed thereon; a body surrounding some of side surfaces and an upper surface of the substrate; a light emitting diode chip positioned on the recess part of the substrate; and a lens positioned on the body, wherein the substrate includes a first step part positioned along an edge of the recess part and a second step part positioned along an edge of a lower surface thereof, and the lower surface of the substrate is exposed to the outside.

17 Claims, 3 Drawing Sheets

(56) References Cited

U.S. PATENT DOCUMENTS

2014/0124812 A1* 5/2014 Kuramoto ............... H01L 24/97
                                                            257/98
2014/0159076 A1* 6/2014 Sota et al. ..................... 257/88
2014/0247578 A1* 9/2014 Chen .................. H01L 25/0753
                                                            362/84

* cited by examiner

LIGHT EMITTING MODULE

CROSS-REFERENCE TO RELATED APPLICATIONS

This application claims priority from and the benefit of U.S. Provisional Patent Application No. 62/005,369, filed on May 30, 2014, which is hereby incorporated by reference for all purposes as if fully set forth herein.

BACKGROUND

Field

The present invention relates to a light emitting module which may efficiently implement slimness, heat dissipation, and moisture-proof.

Discussion of the Background

A general light emitting diode (LED), which is a device emitting light when electrons and holes collide with each other in a p-n semiconductor junction by a current application, is typically manufactured in a package structure in which LED chips are mounted.

Recently, the light emitting diode has been widely used in technology fields such as lighting, a display, and the like due to advantages such as miniaturization, lower consumption of power, and the like. The light emitting diode is included in a light emitting module configured in a plurality of combinations in order to implement surface light required by the technology field such as the lighting, the display, or the like with point light.

Since the light emitting module generally has a plurality of light emitting diodes which are regularly arranged and includes complex components such as a structure for receiving the plurality of light emitting diodes, a heat dissipation structure for improving a degradation in optical property due to heat presented as a disadvantage for the light emitting diode, and the like, there was a limit in implementing slimness.

BRIEF SUMMARY OF THE INVENTION

An object of the present invention is to provide a light emitting module capable of having excellent heat dissipation property and excellent moisture-proofing property as well as implementing advantageous slimness.

According to an exemplary embodiment of the present invention, there is provided a light emitting module including: a substrate having a recess part formed thereon; a body surrounding some of side surfaces and an upper surface of the substrate; a light emitting diode chip positioned on the recess part of the substrate; and a lens positioned on the body, wherein the substrate includes a first step part positioned along an edge of the recess part and a second step part positioned along an edge of a lower surface thereof, and the lower surface of the substrate is exposed from the outside.

DETAILED DESCRIPTION OF THE ILLUSTRATED EMBODIMENTS

Figure 1:
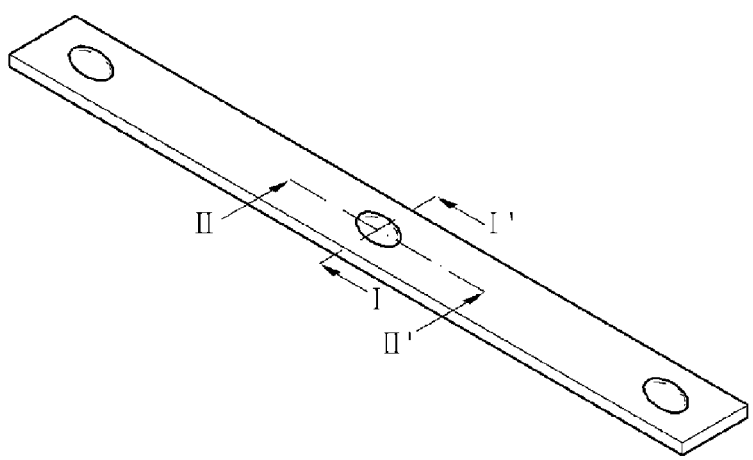
FIG. 1 is a perspective view showing a light emitting module according to an exemplary embodiment of the present invention.
Figure 2:
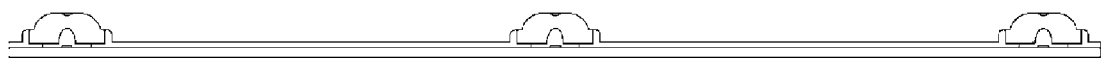
FIG. 2 is a cross-sectional view showing the light emitting module of FIG. 1.

FIG. 1 is a perspective view showing a light emitting module according to an exemplary embodiment of the present invention and FIG. 2 is a cross-sectional view showing the light emitting module of FIG. 1.

Figure 3:
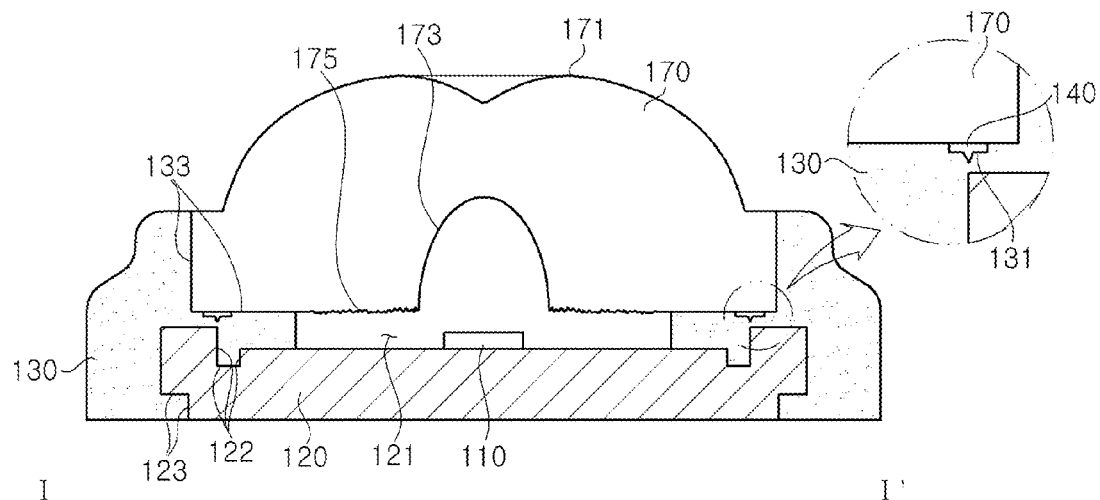
FIG. 3 is a cross-sectional view showing the light emitting module taken along a line I-I' of FIG. 1.
Figure 4:
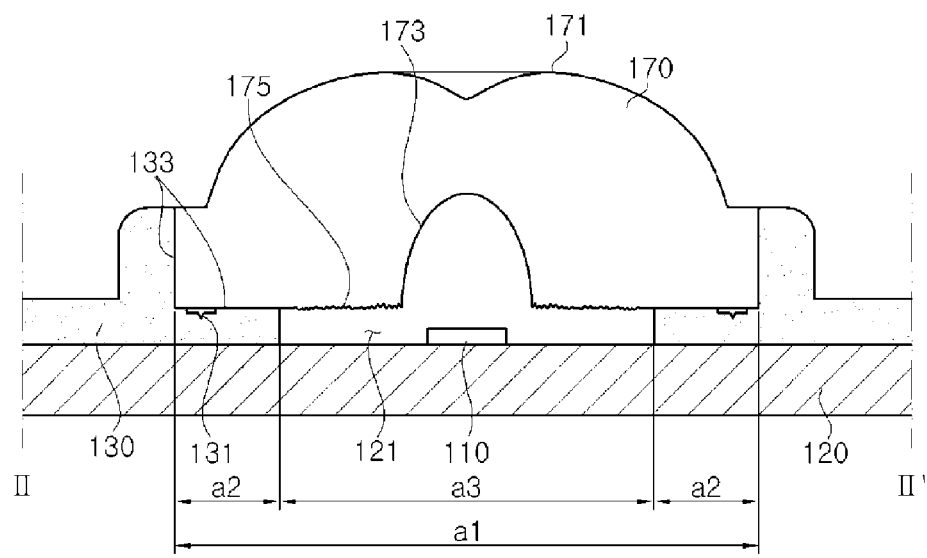
FIG. 4 is a cross-sectional view of the light emitting module taken along a line II-II' of FIG. 1.

FIG. 3 is a cross-sectional view showing the light emitting module taken along a line I-I' of FIG. 1 and FIG. 4 is a cross-sectional view of the light emitting module taken along a line II-II' of FIG. 1.

As shown in FIGS. 1 to 4, a light emitting module 100 according to an exemplary embodiment of the present invention includes a substrate 120, a light emitting diode chip 110, a body 130, and a lens 170.

The substrate 120 is not particularly limited, but a metal PCB having excellent heat dissipation property will be described in the exemplary embodiment of the present invention by way of example. The substrate 120 has a recess part 121 formed in an upper surface thereof.

The substrate 120 has a first step part 122 along an edge of the recess part 121. The first step part 122 has a function of increasing a contact area with the body 130 to improve adhesion between the substrate 120 and the body 130. In addition, the first step part 122 has a function of suppressing water permeation from the outside by structural characteristics thereof.

The substrate 120 has a second step part 123 along an edge of a lower surface thereof. The second step part 123 has a function of improving a bonding between the substrate 120 and the body 130. In addition, the second step part 123 has a function of suppressing water permeation from the outside by a structure thereof.

The lower surface of the substrate 120 is exposed to the outside. Here, the light emitting module 100 may be applied to a lighting device, a screen advertising device, a display device, and the like. Since the substrate 120 of the light emitting module 100 may be directly in contact with outer cases of the lighting device, the screen advertising device, and the display device, the substrate 120 may easily discharge heat from the light emitting diode chip 110.

The body 130 covers some of side surfaces and an upper surface of the substrate 120. Here, the body 130 is spaced apart from the light emitting diode chip 110 by a predetermined interval and covers the edge of the recess part 121 of the substrate 120. The body 130 covers the first and second step parts 122 and 123 of the substrate 120.

The body 130 has a receiving part 133 capable of receiving the lens 170. The receiving part 133 is positioned on an inner side surface of the body 130. The receiving part 133 may face edges of a side surface and a lower surface of the lens 170 so as to be bonded to the side surface and the lower surface of the lens 170. The receiving part 133 has a receiving groove 131 in a region corresponding to the edge of the lower surface of the lens 170. The receiving groove 131 may be a ring type which is seamlessly extended along the edge of the lower surface of the lens 170.

The receiving part 133 is spaced apart from the light emitting diode chip 110 by the predetermined interval on the substrate 120 and is positioned in a limited region. Specifically, when it is defined that a region overlapped with the lens 170 is a first region a1, a region in which the receiving part 133 is formed is a second region a2, and a region corresponding to the upper surface of the substrate 120 exposed from the receiving part 133 is a third region a3, it is preferable to design an area of the second region a2 to be smaller than an area of the third region a3. That is, the present invention has advantageous characteristics in implementing heat dissipation by securing a space between the substrate 120 and the lens 170.

The lens 170 has a light incident surface 173 of a concave shape and a light emitting surface 171 of a convex shape. Although not particularly limited, the light incident surface 173 may be a concave dome type and the light emitting surface 171 may have a center region of the concave dome type. The lens 170 includes a concave and convex pattern 175 formed on the lower surface thereof. The concave and convex pattern 175 has a function of refracting light refracted from the lens 170 in various directions to improve optical characteristics.

The lens 170 may be bonded to the body 130 by a bonding member 140. Here, the bonding member 140 is not particularly limited, and may be silicon. The bonding member 140 is received on the receiving groove 131. That is, the bonding member 140 may be a ring type which is seamlessly extended along the edge of the lower surface of the lens 170.

The light emitting module 100 according to the exemplary embodiment of the present invention may have an advantage of excellent heat dissipation property due to the lower surface of the substrate 120 exposed to the outside and may minimize water permeation by the first step part 122 positioned at the edge of the recess part 121 of the substrate 120 and the second step part 123 positioned at the edge of the lower surface of the substrate 120. Here, the present invention describes a limited case in which the substrate 120 includes both the first and second step parts 122 and 123, but is not limited thereto. For example, the substrate 120 may include one of the first and second step parts 122 and 123.

In addition, according to the present invention, water permeation defect by a hole of a general light emitting module in which a fixing protrusion formed in the lens is fastened to the substrate in which the hole is formed may be minimized by a structure of the receiving part 133 of the body 130 capable of receiving the lens 170.

In addition, according to the present invention, since the concave and convex pattern 175 is formed on the lower surface of the lens 170, optical characteristics may be improved.

In addition, according to the present invention, a bending of a short axis and a long axis of the substrate 120 may be prevented by improving rigidity of the substrate 120 by the structure of the substrate 120 including the first and second step parts 122 and 123.

Figure 5:
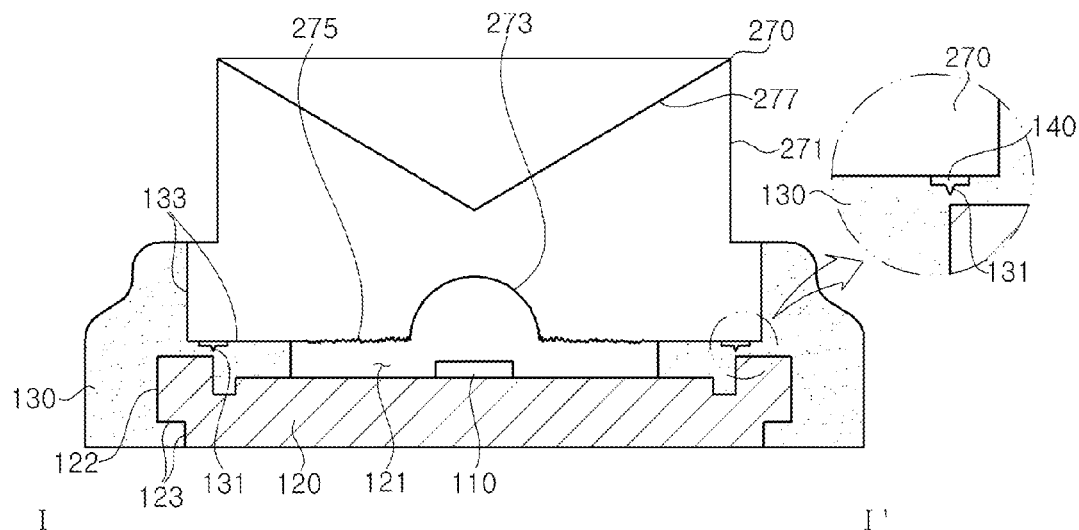
FIG. 5 is a perspective view showing a light emitting module according to another exemplary embodiment of the present invention.
Figure 6:
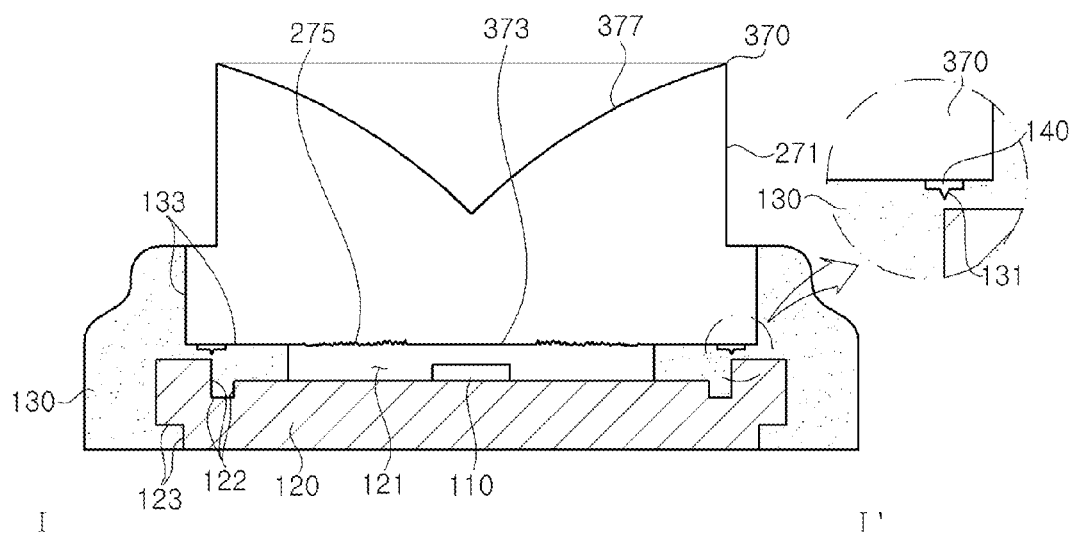
FIG. 6 is a perspective view showing a light emitting module according to still another embodiment of the present invention.

FIG. 5 is a perspective view showing a light emitting module according to another exemplary embodiment of the present invention and FIG. 6 is a perspective view showing a light emitting module according to still another exemplary embodiment of the present invention.

As shown in FIG. 5, since the light emitting module according to another exemplary embodiment of the present invention has the same structure as the light emitting module according to the exemplary embodiment of the present invention except for a lens 270, the same reference numerals are used and a detailed description thereof will be omitted.

The lens 270 may be a TIR lens having a total reflection function on an upper surface thereof. That is, the lens 270 has a light incident surface 273 of a concave shape, a reflecting part 277 positioned on an upper surface thereof, and a light emitting surface 271 positioned on a side surface thereof, and includes a concave and convex pattern 275 positioned around the light incident surface 273.

As shown in FIG. 6, since the light emitting module according to still another exemplary embodiment of the present invention has the same structure as the light emitting module according to another exemplary embodiment of the present invention except for a lens 370, the same reference numerals are used and a detailed description thereof will be omitted.

The lens 370 has a light incident surface 373 of a surface type, and has a reflecting part 377 having a predetermined curvature. The lens 370 may include any one of the light incident surface 373 of the surface type and the reflecting part 377 having the curvature.

Referring to FIGS. 5 and 6, the light emitting module according to the present invention may have an advantage of excellent heat dissipation property due to the lower surface of the substrate 120 exposed to the outside and may minimize water permeation by the first step part 122 positioned at the edge of the recess part 121 of the substrate 120 and the second step part 123 positioned at the edge of the lower surface of the substrate 120. Here, the present invention describes a limited case in which the substrate 120 includes both the first and second step parts 122 and 123, but is not limited thereto. For example, the substrate 120 may include one of the first and second step parts 122 and 123.

In addition, according to the present invention, water permeation defect by a hole of a general light emitting module in which a fixing protrusion formed in the lens is fastened to the substrate in which the hole is formed may be minimized by a structure of the receiving part 133 of the body 130 capable of receiving the lenses 270 and 370.

In addition, according to the present invention, since the concave and convex pattern 275 is formed on the lower surfaces of the lenses 270 and 370, optical characteristics may be improved.

In addition, according to the present invention, a bending of a short axis and a long axis of the substrate 120 may be prevented by improving rigidity of the substrate 120 by the structure of the substrate 120 including the first and second step parts 122 and 123.

What is claimed is:

1. A light emitting module, comprising:
   a substrate comprising:
   an upper surface comprising a first portion, a central portion positioned below the first portion, and a second portion positioned below the first portion and the central portion;
   a side surface positioned below the first portion of the upper surface;
   a lower surface;
   a first step part positioned along an edge of the central portion of the upper surface; and
   a second step part positioned along an edge of the lower surface;
   a body covering the first portion, central portion, second portion of the upper surface of the substrate and covering the side surface of the substrate;
   a light emitting diode chip positioned on the central portion of the substrate; and
   a lens positioned on the body such that the lens is spaced apart from the substrate and the light emitting diode chip and directly contacts the body,
   wherein the first step part comprises:
   the second portion of the upper surface of the substrate, a first side surface extending from the first portion of the upper surface of the substrate to the second portion of the upper surface of the substrate, and a second side surface that is shorter than the first side surface, the second side surface extending from the central portion of the upper surface of the substrate to the second portion of the upper surface of the substrate.

2. The light emitting module of claim 1, wherein the body comprises a receiving part positioned on an inner side surface of the body that directly contacts and receives the lens, the receiving part comprising a groove corresponding to an edge of a lower surface of the lens.

3. The light emitting module of claim 2, wherein the lens is bonded to the body by a bonding member disposed in the groove of the receiving part.

4. The light emitting module of claim 2, wherein the receiving part of the body is spaced apart from the light emitting diode chip.

5. The light emitting module of claim 2, wherein the receiving part of the body is bonded the lower surface of the lens.

6. The light emitting module of claim 2, wherein the groove extends along the edge of the lower surface of the lens as a ring around the lens.

7. The light emitting module of claim 3, wherein the bonding member comprises silicon.

8. The light emitting module of claim 6, wherein:

the light emitting module further comprises a first region corresponding to the first portion of the upper surface and the second portion of the upper substrate of the substrate that is overlapped by both the receiving part and the lens and a second region corresponding to a third portion of the upper surface of the substrate exposed from the receiving part of the body, and the first region has a smaller area than the second region.

9. The light emitting module of claim 1, wherein the lens comprises a light incident surface having a concave shape.

10. The light emitting module of claim 9, wherein the lens further comprises a light emitting surface having a convex shape.

11. The light emitting module of claim 10, wherein the light incident surface forms a concave dome.

12. The light emitting module of claim 11, wherein the light emitting surface has a concave center portion.

13. The light emitting module of claim 12, wherein a lower surface of the lens comprises a concave and convex pattern that is configured to refract light.

14. The light emitting module of claim 9, wherein the lens comprises a reflecting part disposed on an upper surface of the lens.

15. The light emitting module of claim 14, wherein the lens comprises a light emitting side surface.

16. The light emitting module of claim 15, wherein a lower surface of the lens comprises a concave and convex pattern surrounding the light incident surface and the concave and convex pattern is configured to refract light.

17. The light emitting module of claim 1, wherein the lens comprises a light incident surface having a flat shape and a reflecting part as an upper surface having a curvature.

* * * * *